US010761978B2

(12) United States Patent
Hughes et al.

(10) Patent No.: US 10,761,978 B2
(45) Date of Patent: Sep. 1, 2020

(54) WRITE ATOMICITY MANAGEMENT FOR MEMORY SUBSYSTEMS

(71) Applicant: Micron Technology, Inc., Boise, ID (US)

(72) Inventors: Nathan Jared Hughes, Timnath, CO (US); Karl D. Schuh, Santa Cruz, CA (US); Tom Geukens, Longmont, CO (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/171,261

(22) Filed: Oct. 25, 2018

(65) Prior Publication Data
US 2020/0133833 A1 Apr. 30, 2020

(51) Int. Cl.
*G06F 12/02* (2006.01)
*G06F 3/06* (2006.01)
*G06F 16/23* (2019.01)
*G11C 16/10* (2006.01)
*G06F 12/14* (2006.01)
*G06F 12/1009* (2016.01)

(52) U.S. Cl.
CPC .......... *G06F 12/0246* (2013.01); *G06F 3/061* (2013.01); *G06F 3/0659* (2013.01); *G06F 3/0679* (2013.01); *G06F 12/1009* (2013.01); *G06F 12/1441* (2013.01); *G06F 12/1475* (2013.01); *G11C 16/10* (2013.01); *G06F 2212/7201* (2013.01); *G06F 2212/7209* (2013.01)

(58) Field of Classification Search
CPC . G06F 12/0246; G06F 3/0679; G06F 16/2365
See application file for complete search history.

(56) References Cited

U.S. PATENT DOCUMENTS

| 2013/0145064 A1 | 6/2013 | Radovanovic |
| 2014/0143476 A1 | 5/2014 | Sela et al. |
| 2014/0281145 A1* | 9/2014 | Tomlin ................ G06F 12/0246 711/103 |
| 2015/0039577 A1 | 2/2015 | Talagala et al. |
| 2017/0160933 A1 | 6/2017 | De et al. |
| 2017/0160988 A1* | 6/2017 | Nemoto ................ G06F 3/0619 |
| 2017/0168951 A1 | 6/2017 | Kanno |
| 2017/0185354 A1* | 6/2017 | Doshi ................... G06F 3/0619 |
| 2018/0004454 A1* | 1/2018 | Sampathkumar ....... G06F 3/061 |
| 2018/0032267 A1* | 2/2018 | Koul ..................... G06F 3/0607 |
| 2019/0286364 A1* | 9/2019 | Gavens ............... H01L 27/1052 |

OTHER PUBLICATIONS

International Search Report and Written Opinion, PCT App. No. PCT/US2019/053905, dated Jan. 16, 2020, 10 pages.

* cited by examiner

*Primary Examiner* — David E Martinez
(74) *Attorney, Agent, or Firm* — Nicholson De Vos Webster & Elliott LLP

(57) ABSTRACT

Exemplary methods, apparatuses, and systems include receiving an instruction to atomically write data to a memory component. A plurality of write commands for the first data are generated, including an end of atom indicator. The first plurality of write commands are sent to the memory component while accumulating a plurality of translation table updates corresponding to the write commands One or more translation tables are updated with the plurality of translation table updates in response to determining that the final write command has been successfully sent to the memory component.

20 Claims, 4 Drawing Sheets

WRITE ATOMICITY MANAGEMENT FOR MEMORY SUBSYSTEMS

TECHNICAL FIELD

The present disclosure generally relates to memory subsystems, and more specifically, relates to write atomicity management in memory subsystems.

BACKGROUND ART

A memory subsystem can be a storage system, such as a solid-state drive (SSD), and can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to table update accumulator in a memory subsystem. A memory subsystem is also hereinafter referred to as a "memory device". An example of a memory subsystem is a storage system, such as a solid-state drive (SSD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

Conventional approaches to atomic write operations is to aggregate an entire piece of data in working memory before sending the entire piece of data to a memory component to be written and then updating the logical-to-physical translation tables to reflect the write operation. This approach results in inconsistent performance because the memory components are under-utilized while waiting for the entire piece of data to be aggregated.

Aspects of the present disclosure address the above and other deficiencies by decoupling the writing of data to a memory component from the updates to the translation tables. Chunks of data corresponding to an atomic write operation is written to non-volatile storage in a memory component as the data is received from a host system or host process, while updates to the translation tables are accumulated by the memory subsystem as chunks of data are sent to the memory component. Each chunk of data sent to the memory subsystem is associated with an atomicity indicator, such as start, middle, and end-of-atom. Once the chunk of data associated with the end-of-atom indicator is successfully sent to the memory component, the accumulated translation table updates are applied to the translation tables, completing the atomic write operation. This approach improves upon conventional approach by smoothing performance by sending data to the memory component as it is received while maintaining atomicity of the write operation by withholding the translation table updates until after all the data is written.

Figure 1:
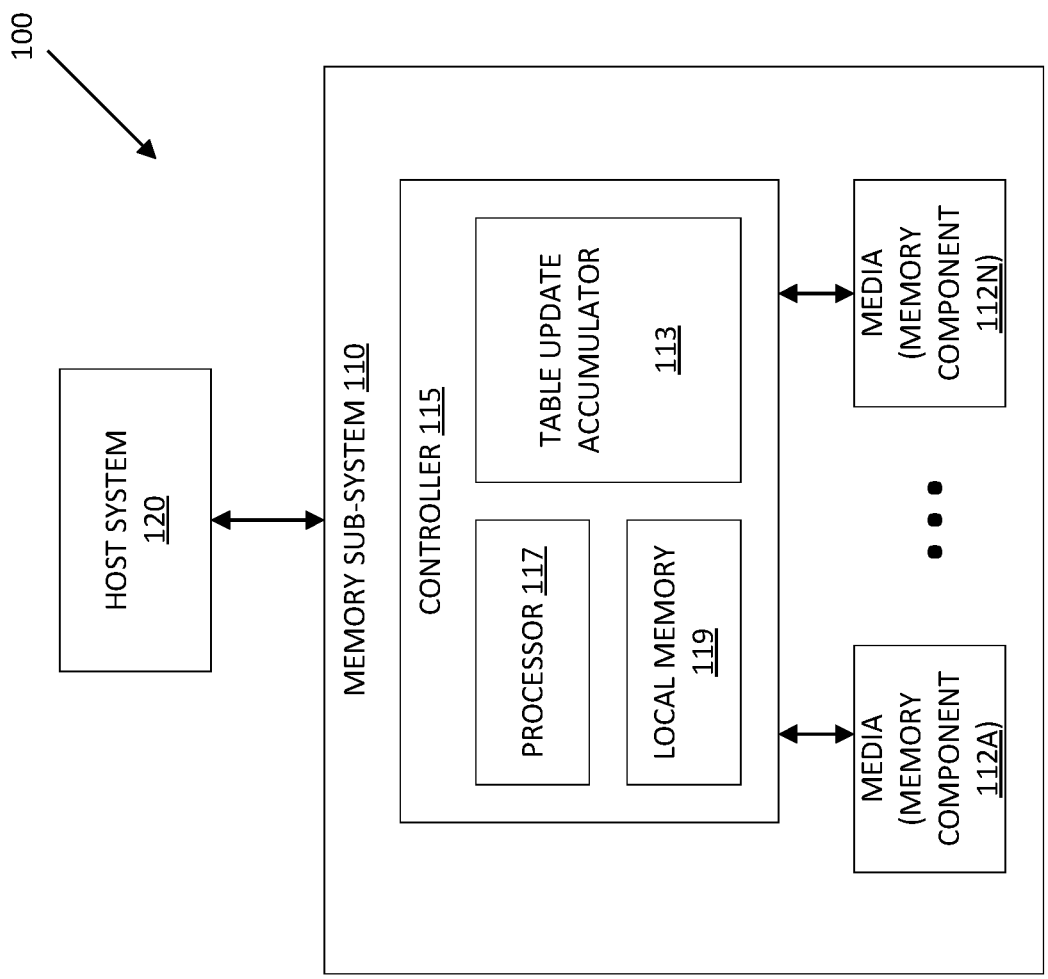
FIG. 1 illustrates an example computing environment that includes a memory subsystem in accordance with some embodiments of the present disclosure.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes a table update accumulator 113 that can accumulate updates to logical to physical address tables until an atomic write operation to memory components 112A to 112N is complete. In some embodiments, the controller 115 includes at least a portion of the table update accumulator 113. For example, the controller 115 can include a processor 117 (processing device) configured to execute instructions stored in local memory 119 for performing the operations described herein. In some embodiments, the table update accumulator 113 is part of the host system 110, an application, or an operating system.

The table update accumulator 113 accumulates translation table updates until an entire atom of data is confirmed as sent to the memory component to be written. Further details with regards to the operations of the table update accumulator 113 are described below.

Figure 2:
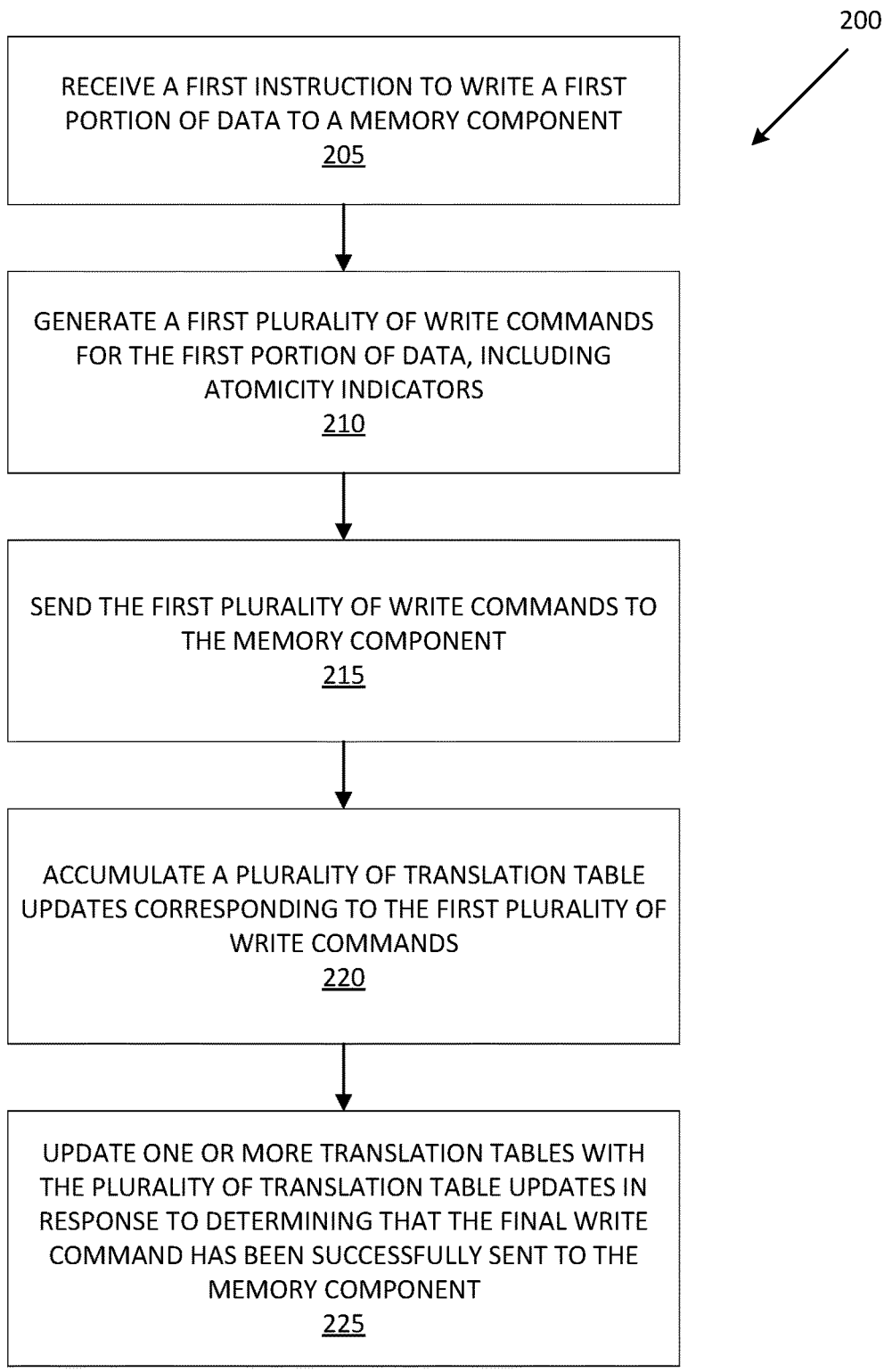
FIG. 2 is a flow diagram of an example method to manage atomicity in writes in accordance with some embodiments of the present disclosure.

FIG. 2 is a flow diagram of an example method 200 to manage atomicity in writes, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed using the table update accumulator 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 205, the processing device receives a first instruction to write a portion of data to a memory component. In one embodiment, the first instruction requests an atomic write of the first data to a range of logical block addresses. In one embodiment, the processing device translates the logical block addresses to physical addresses using translation tables (not illustrated) which can be stored in local memory 119. For example, the processing device can use a flash translation layer (FTL) table or another logical-to-physical translation table. In one embodiment, the size of the first data requires more than one write command to be sent to the memory component (e.g., memory component 112A).

At block 210, the processing device generates a first plurality of write commands for the first data, including one or more atomicity indicators. For example, the processing device divides the data into chunks such that each chunk of data can be written to a memory component via a single write command. In one embodiment, the processing device assigns an "end of atom" indicator to the last write command and chunk of data. In another embodiment, each write command associated with the first data is assigned an atomicity indicator, such as start, middle, and end-of-atom. Write commands can also include an atomicity section identifier indicating with which atomic write instruction the write command is associated. The processing device adds the one or more atomicity indicators as metadata to be written along with the corresponding chunk(s) of data.

At block 215, the processing device sends the first plurality of write commands to the memory component. In one embodiment, the processing device aggregates data in write commands to be sent to the memory component up to a certain amount of data (e.g., 64 kb) before sending the write command to the memory component. By contrast, in one example, an atomic write instruction received from, e.g., the host system 110 can include up to 256 kb of data to be written atomically. In this example, the processing device splits the write instruction into four write commands of 64 kb. Each of the four write commands includes an atomicity indicator, including an end-of-atom indicator in the last write command. For example, atomicity indicators can include a start-of-atom indicator, atomicity-continued indicator, an end-of-atom indicator, and a full-atom indicator (e.g., if the write instruction is not split and fits in a single command) In other embodiments, atomic write instructions can include up to an atomic size limit of data (e.g., 256 kb) that can be written atomically. Write commands to a memory component can include up to an optimal write command size limit of data (e.g., 64 kb) which the processing device can aggregate in a write command before sending the write command to the memory component. The write commands can be sent over a bus to the memory component for processing by logic in the memory component. In one embodiment, the write commands are sent to the memory component at a rate that is most efficient for the memory component, which can be tuned by adjusting how much data (64 kb in the example above) is accumulated before sending a write command. In one embodiment, multiple write instructions from the host system are processed in parallel, including multiple different atomic write instructions.

At block 220, the processing device accumulates a plurality of translation table updates corresponding to the first plurality of write commands. In one embodiment, each write command associated with an atomic write instruction causes a chunk of the data to be written to the memory component. The successful write of a chunk of data requires a corresponding update to the translation table so that the logical address expected by the host system points to the physical location in the memory component where the chunk is written. Data in an atomic write is written entirely or not at all. In one embodiment, while chunks or portions of the data are written to memory component(s) as they are received, the atomic nature of the write is accomplished by delaying updates to the translation tables until confirming that the entire atom of data has been written to the memory component(s). Until the processing device updates the translation tables, requests from host 110 are unable to access the written portion of the data included in the atomic write so that atomicity in maintained.

At block 225, the processing device updates one or more translation tables with the plurality of translation table updates in response to determining that the final write command has been successfully sent to the memory component. In one embodiment, the atom is considered fully written when all write commands associated with the atom are confirmed by the memory component. For example, the processing device can detect that the entire atom is written when a memory component confirms success of a write of the last chunk of data that includes the "end of atom" indicator. In one embodiment, an atomic write may be interrupted by a failure (e.g., an unexpected power loss) that prevents the memory subsystem from receiving all of the data of an atomic write from the host system or the processing device from sending one or more write commands associated with the write instruction to the memory component. When recovering from the failure, if the processing device determines that the last write command indicated by the end-of-atom atomicity indicator was not completed by the memory component prior to the failure, the processing device will abort the atomic write by discarding the accumulated translation table updates. For example, the processing device flags any data subject to an incomplete atomic write for garbage collection. In another embodiment of recovery, if the processing device determines that the write commands associated with the atomic write instruction were successfully written to the memory component but the translation tables were not updated, the processing device can update the translation tables when recovering from the failure to complete the atomic write. For example, the processing device may read the memory components and detect that the last chunk of data that includes the "end of atom" indicator was written to one or more memory components. In this embodiment, the accumulate translation tables are stored in non-volatile media (e.g., memory component(s) 112A-112N).

Figure 3:
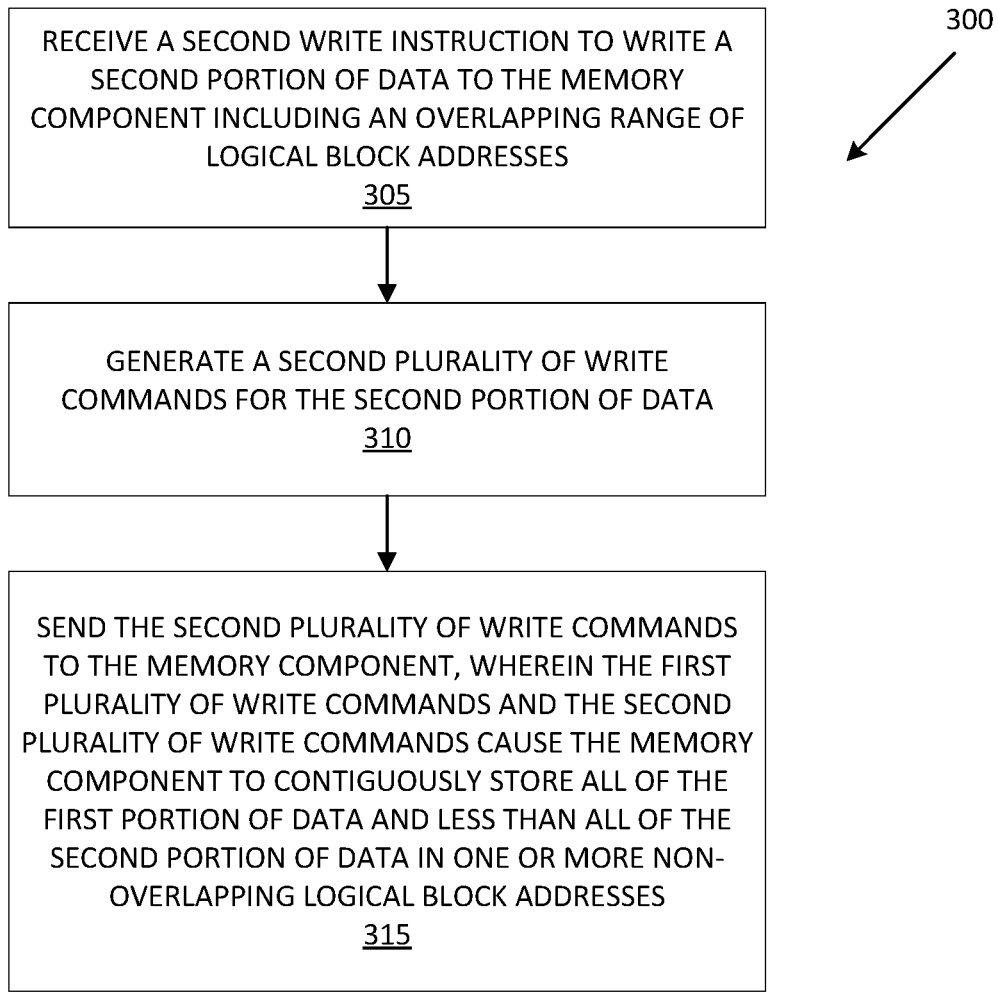
FIG. 3 is a flow diagram of an example method to manage atomicity in overlapping writes in accordance with some embodiments of the present disclosure.

FIG. 3 is a flow diagram of an example method 300 to manage atomicity in writes, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed using the table update accumulator 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 305, the processing device receives a second atomic write instruction to write a second data to the memory component including a range of logical block addresses that overlap with the range of logical block addresses of the first write instruction (e.g., described with reference to FIG. 2). For example, the processing device can detect write instructions directed to overlapping ranges of logical block addresses. To maintain the atomic nature of the two atomic write instructions, the processing device serializes the two atomic write instructions so that the resulting data in memory reflects the first atomic write instruction followed by the second atomic write instruction or vice versa. In one embodiment, the processing device guarantees that all the data from the first atomic write instruction is written to the memory component(s) followed by all of the data from the second atomic write instruction, or vice versa, but not interleaved. In another embodiment, the processing device interleaves the write instructions and ensures data coherency (e.g., via a lock or coherency manager) by preventing the overlapping logical block address range from being written simultaneously and determining which write instruction prevails in all the overlapping logical block address range.

In one embodiment, the processing device serializes atomic write instructions by creating a lock on the region of memory targeted by an atomic write instruction. The lock causes the processing device to block processing of other write commands including a portion of the locked region of memory from proceeding until after the write instruction responsible for the lock is completed. For example, the processing device can lock the region of memory targeted by the first write instruction and block the second write instruction from proceeding until after the first write instruction is complete.

At block 310, the processing device generates a second plurality of write commands for the second data similarly to generating the first plurality of write commands described in relation to block 210 of FIG. 2.

At block 315, the processing device sends the second plurality of write commands to the memory component. In one embodiment, the processing device sends the first plurality of write commands to the memory component(s) before the second plurality of write commands. For example, the processing device can send the second plurality of write commands to the memory component in response to the completion of the first plurality of write commands or the completion of the overlapping portion of the first plurality of write commands. In this embodiment, the memory component(s) will store all of the portion of data in the second write instruction in non-volatile memory, while the memory controller(s) will store one or more blocks of the portion of data included in the first write instruction that do not overlap with the portion of data in the second write instruction. In one embodiment, the processing device begins sending the second plurality of write commands in response to the release of a lock on the block addresses overlapping with the first plurality of write commands.

Figure 4:
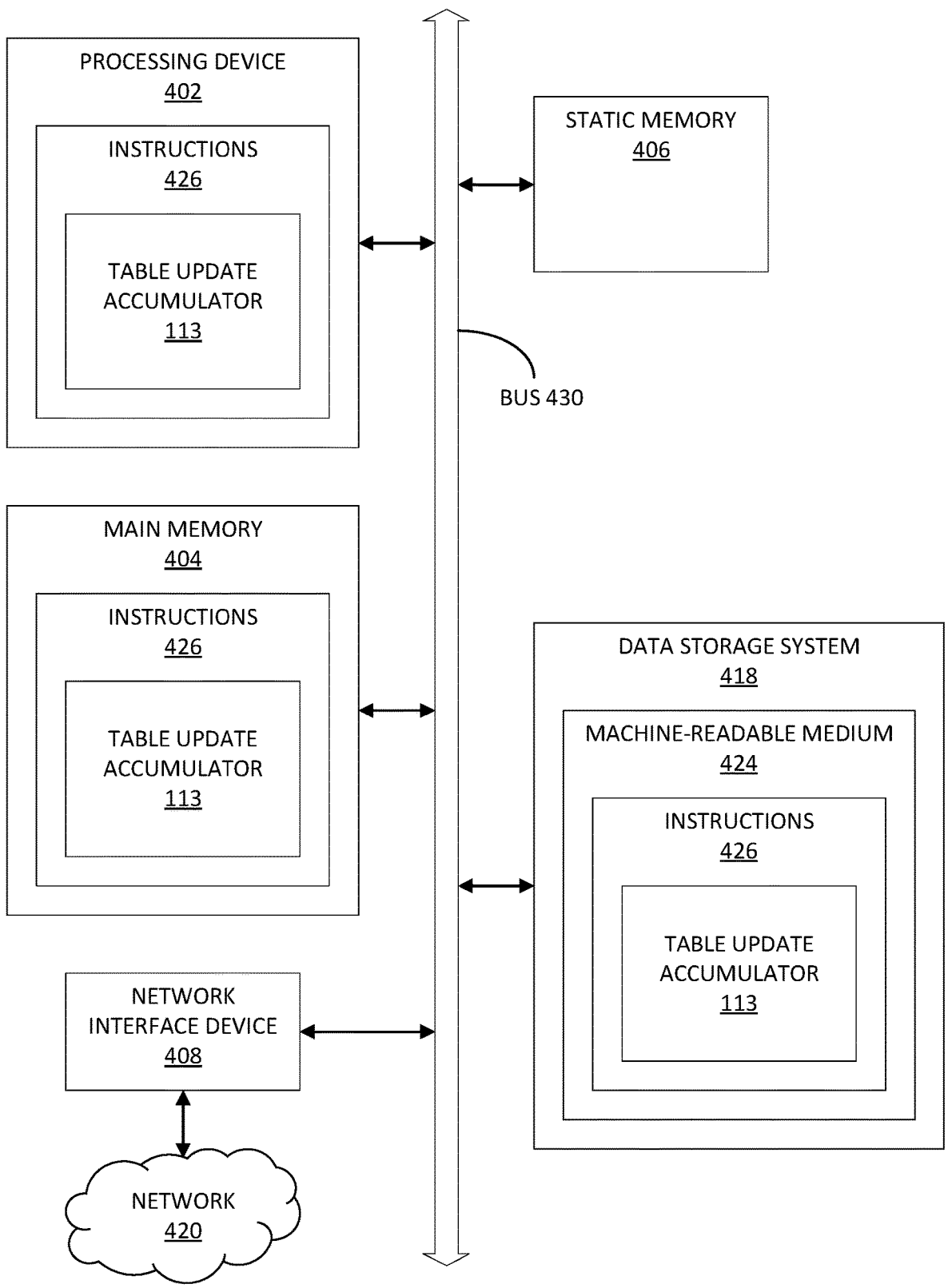
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the table update accumulator 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a table update accumulator (e.g., the table update accumulator component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. For example, a computer system or other data processing system, such as the controller 115, may carry out the computer-implemented methods 200 and 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A computer-implemented method comprising:
   receiving, from a host system, a first instruction to write a first portion of data to a memory component, wherein the first instruction is an atomic write of the first portion of data and wherein a size of the first portion of data requires more than one write command to be sent to the memory component;
   generating a first plurality of write commands for the first portion of data, responsive to the receiving the first instruction, wherein a final write command includes an end-of-atom atomicity indicator;
   sending the first plurality of write commands to the memory component;
   accumulating a plurality of translation table updates corresponding to the first plurality of write commands; and
   updating one or more translation tables with the plurality of translation table updates in response to determining that the final write command has been successfully sent to the memory component.

2. The method of claim 1, wherein the one or more translation tables includes a mapping from logical block addresses to physical addresses in the memory component.

3. The method of claim 1, wherein each write command includes an atomicity indicator.

4. The method of claim 1, wherein the first instruction includes a first range of logical block addresses specifying where to write the first portion of data and further comprising:
   obtaining a lock on the first range of logical block addresses, wherein the lock prevents the host system from writing to the first range of logical block addresses.

5. The method of claim 4, further comprising:
   releasing the lock on the first range of logical block addresses in response to determining the final write command has been successfully sent to the memory component.

6. The method of claim 5, further comprising:
   receiving, from the host system, a second write instruction to write a second portion of data to the memory component, wherein the second write instruction includes a second range of logical block addresses and wherein the second range of logical block addresses overlaps the first range of logical block addresses;
   generating a second plurality of write commands for the second portion of data; and
   sending the second plurality of write commands to the memory component, wherein the first plurality of write instructions and the second plurality of write instructions cause the memory component to contiguously store all of the first portion of data and less than all of the second portion of data in one or more logical block addresses in the second range of logical block addresses, wherein the one or more logical block addresses are non-overlapping with the first range of logical block addresses.

7. The method of claim 6, wherein the first write instruction is received from a first process executing on the host system and wherein the second write instruction is received from a second process executing on the host system.

8. A non-transitory computer-readable storage medium comprising instructions that, when executed by a processing device, cause the processing device to:
   receiving, from a host system, a first instruction to write a first portion of data to a memory component, wherein the first instruction is an atomic write of the first portion of data and wherein a size of the first portion of data requires more than one write command to be sent to the memory component;

generating a first plurality of write commands for the first portion of data, responsive to the receiving the first instruction, wherein a final write command includes an end-of-atom atomicity indicator;

sending the first plurality of write commands to the memory component;

accumulating a plurality of translation table updates corresponding to the first plurality of write commands; and updating one or more translation tables with the plurality of translation table updates in response to determining that the final write command has been successfully sent to the memory component.

9. The non-transitory computer-readable medium of claim 8, wherein the one or more translation tables includes a mapping from logical block addresses to physical addresses in the memory component.

10. The non-transitory computer-readable medium of claim 8, wherein each write command includes an atomicity indicator.

11. The non-transitory computer-readable medium of claim 8, wherein the first instruction includes a first range of logical block addresses specifying where to write the first portion of data and further comprising:

obtaining a lock on the first range of logical block addresses, wherein the lock prevents the host system from writing to the first range of logical block addresses.

12. The non-transitory computer-readable medium of claim 11, releasing the lock on the first range of logical block addresses in response to determining the final write command has been successfully sent to the memory component.

13. The non-transitory computer-readable medium of claim 12, wherein the processing device is further to:

receiving, from the host system, a second write instruction to write a second portion of data to the memory component, wherein the second write instruction includes a second range of logical block addresses and wherein the second range of logical block addresses overlaps the first range of logical block addresses;

generating a second plurality of write commands for the second portion of data; and sending the second plurality of write commands to the memory component, wherein the first plurality of write instructions and the second plurality of write instructions cause the memory component to contiguously store all of the first portion of data and less than all of the second portion of data in one or more logical block addresses in the second range of logical block addresses, wherein the one or more logical block addresses are non-overlapping with the first range of logical block addresses.

14. The non-transitory computer-readable medium of claim 13, wherein the first write instruction is received from a first process executing on the host system and wherein the second write instruction is received from a second process executing on the host system.

15. A system comprising:
a memory component; and
a processing device, operatively coupled with the memory component, to:

receive, from a host system, a first instruction to write a first portion of data to the memory component, wherein the first instruction is an atomic write of the first portion of data and wherein a size of the first portion of data requires more than one write command to be sent to the memory component and wherein the first instruction includes a first range of logical block addresses specifying where to write the first portion of data;

obtain a lock on the first range of logical block addresses, wherein the lock prevents the host system from writing to the first range of logical block addresses;

generate a first plurality of write commands for the first portion of data, responsive to the receiving the first instruction, wherein a final write command includes an end-of-atom atomicity indicator;

send the first plurality of write commands to the memory component;

accumulate a plurality of translation table updates corresponding to the first plurality of write commands; and update one or more translation tables with the plurality of translation table updates in response to determining that the final write command has been successfully sent to the memory component.

16. The system of claim 15, wherein the one or more translation tables includes a mapping from logical block addresses to physical addresses in the memory component.

17. The system of claim 15, wherein each write command includes an atomicity indicator.

18. The system of claim 17, wherein the processing device is further to:

release the lock on the first range of logical block addresses in response to determining the final write command has been successfully sent to the memory component.

19. The system of claim 18, wherein the processing device is further to:

receive, from the host system, a second write instruction to write a second data to the memory component, wherein the second write instruction includes a second range of logical block addresses and wherein the second range of logical block addresses overlaps the first range of logical block addresses;

generate a second plurality of write commands for the second data; and send the second plurality of write commands to the memory component, wherein the first plurality of write instructions and the second plurality of write instructions cause the memory component to contiguously store all of the first data and less than all of the second data in one or more logical block addresses in the second range of logical block addresses, wherein the one or more logical block addresses are non-overlapping with the first range of logical block addresses.

20. The system of claim 19, wherein the first write instruction is received from a first process executing on the host system and wherein the second write instruction is received from a second process executing on the host system.

* * * * *